(12) United States Patent
Sato et al.

(10) Patent No.: US 8,710,890 B2
(45) Date of Patent: Apr. 29, 2014

(54) VARIABLE DELAY LINE FOR DELAY LOCKED LOOP

(75) Inventors: Noriaki Sato, Odawara (JP); Kouzaburo Kurita, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/547,743

(22) Filed: Jul. 12, 2012

(65) Prior Publication Data

US 2013/0049829 A1 Feb. 28, 2013

(30) Foreign Application Priority Data

Aug. 26, 2011 (JP) .................. 2011-184264

(51) Int. Cl.
*H03H 11/26* (2006.01)
*H03K 5/13* (2014.01)
(52) U.S. Cl.
CPC ...................................... *H03K 5/133* (2013.01)
USPC .......................................................... 327/261

(58) Field of Classification Search
USPC ......... 327/147–159, 261, 263, 264, 269–272, 327/276–278, 281, 284, 285; 375/373–376; 331/1 R
See application file for complete search history.

(56) References Cited

U.S. PATENT DOCUMENTS 6,806,753 B2 * 10/2004 Kawasumi .................... 327/261
6,975,149 B2 * 12/2005 Mikhalev et al. ............. 327/158

FOREIGN PATENT DOCUMENTS

| JP | 2005-292947 A | 10/2005 |
|----|---------------|---------|
| JP | 2011-082639 A | 4/2011  |

* cited by examiner

*Primary Examiner* — Lincoln Donovan
*Assistant Examiner* — Sibin Chen
(74) *Attorney, Agent, or Firm* — Miles & Stockbridge P.C.

(57) ABSTRACT

In a multi-stage switching-type delay circuit, occurrence of a hazard is inhibited at the time of the switching of the number of stages. With the multi-stage switching-type delay circuit, an input IN of the delay circuit is connected to a stage that is not selected as a path for causing a delay in order to prevent a logic state of each of the internal nodes of the delay circuit from being changed between before and after the switching of the number of stages.

10 Claims, 10 Drawing Sheets

FIG. 14

| SETTING OF THE NUMBER OF STAGES | IF THE NUMBER OF STAGES SET ON A DATA SIDE IS SMALLER TAP_D<TAP_C | IF THE NUMBER OF STAGES SET ON A DATA SIDE IS GREATER TAP_D>TAP_C |
|---|---|---|
| RISE IN POLARITY SIGNAL=0 | ACTEST_IN<br>A (DIN)<br>B1 (DOUT)<br>B2 (DOUT)<br>C1 (FF_D)<br>C2 (FF_CK)<br>ACTEST_OUT — Don't Care / H | ACTEST_IN<br>A (DIN)<br>B1 (DOUT)<br>B2 (DOUT)<br>C1 (FF_D)<br>C2 (FF_CK)<br>ACTEST_OUT — Don't Care / L |
| FALL IN POLARITY SIGNAL=1 | ACTEST_IN<br>A (DIN)<br>B1 (DOUT)<br>B2 (DOUT)<br>C1 (FF_D)<br>C2 (FF_CK)<br>ACTEST_OUT — Don't Care / H | ACTEST_IN<br>A (DIN)<br>B1 (DOUT)<br>B2 (DOUT)<br>C1 (FF_D)<br>C2 (FF_CK)<br>ACTEST_OUT — Don't Care / L |
| FF EXPECTED VALUE | DATA IS FETCHED SOONER THAN CLOCK (HIGH FETCH) | DATA IS FETCHED LATER THAN CLOCK (LOW FETCH) |

VARIABLE DELAY LINE FOR DELAY LOCKED LOOP

CLAIM OF PRIORITY

The present application claims priority from Japanese patent application JP 2011-184264 filed on Aug. 26, 2011, the content of which is hereby incorporated by reference into this application.

BACKGROUND

The present invention relates to a delay circuit, a DLL circuit, and a semiconductor device provided with the DLL circuit.

A delay circuit is one of the constituent circuits of a delay locked loop (DLL: Delay Locked Loop) circuit. High-speed data-transfer technology is essential in the highly advanced information society of today, and progress toward a higher speed is underway even at an interface of a double data rate (DDR) memory using the DLL circuit.

One basic configuration of the delay circuit is a multi-stage switching-type delay circuit. A multi-stage switching-type delay circuit is represented by a method whereby a delay amount is adjusted by switching the number of stages of a gate, and the method has a point in its favor in that the delay amount is proportional to the number of stages. However, there can be the case where a hazard occurs at the time of switching the number of stages.

In Japanese Unexamined Patent Application Publication No. 2005-292947, the number of stages is controlled with two-hot encoding in order to hold back a hazard period to a minimum against hazard occurrence at the time of switching the number of stages. More specifically, a technology has been disclosed whereby a turn-back stage and the next stage are controlled to enable hazard occurrence to be held back so as to correspond only to a delay element that is newly passed through by the switching of the number of stages.

SUMMARY

With a multi-stage switching-type delay circuit, there is the case where a hazard occurs at the time of switching of the number of stages. The reason for hazard occurrence at the time of switching of the number of stages is because the switching of the number of stages will cause a change in logic state of an internal node, and a logic state prior to the switching of the number of stages is reflected in an output before the change settles into its normal state. With the use of the technology described in JP-A-2005-292947, a hazard period at the time of the switching the number of stages can be shortened but a hazard still occurs.

Further, since a circuit for removal of the impact of a hazard is provided, a logic scale of a DLL circuit as well as a semiconductor device will increase, and the technology is at a disadvantage in respect to processing speed because of time necessary for waiting until the impact of the hazard is settled. Meanwhile, the impact of a hazard occurring at the time of switching the number of stages, accompanying an increase in speed, has become non-negligible at, for example, an interface of a DDR memory.

The present invention has been developed in view of the problems described above, and it is an object of the invention to inhibit hazard occurrence due to switching of the number of stages in a delay circuit.

A gist of a representative embodiment of the invention disclosed under the present application is briefly described as follows.

There is provided a delay circuit as a multi-stage switching-type delay circuit, comprising a stage that is not selected as a path for causing a delay, and an input of the delay circuit is connected to the not-selected stage in order to prevent a logic state of each of the internal nodes of the delay circuit from being changed between before and after switching the number of stages.

Thus, hazard occurrence in the delay circuit can be inhibited, so that it is possible to reduce a logic scale of a DLL circuit as well as a semiconductor device provided with the delay circuit, and to contribute to lower power consumption, and enhancement in processing speed of the semiconductor device.

BRIEF DESCRIPTION OF THE DRAWINGS

FIG. 14 is a chart for easy understanding of a test method of the simplified delay test circuit of FIG. 13.

DETAILED DESCRIPTION

First Embodiment

Figure 1:
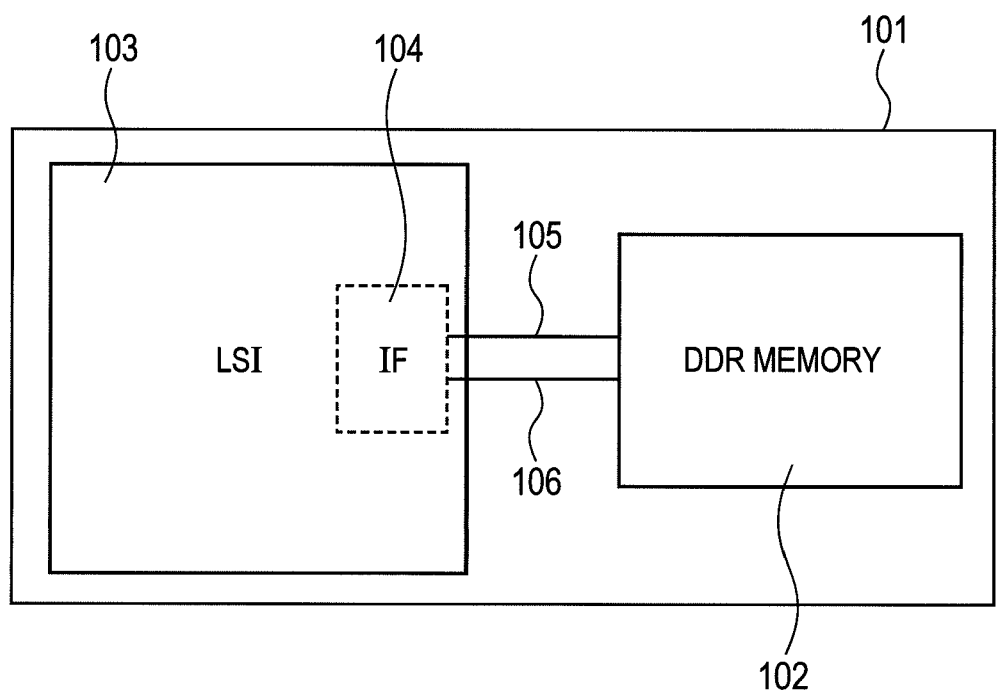
FIG. 1 is a view showing an embodiment of a semiconductor device according to the invention.

In FIG. 1, there is shown a first embodiment of a semiconductor device 101 according to the invention. The semiconductor device 101 includes a DDR memory 102, and a large-scale integrated circuit (LSI) 103. Further, the LSI 103 has an interface (IF) 104 with the DDR memory, and the IF 104 is connected to the DDR memory 102 via a data line 105 and a clock line 106.

Figure 2:
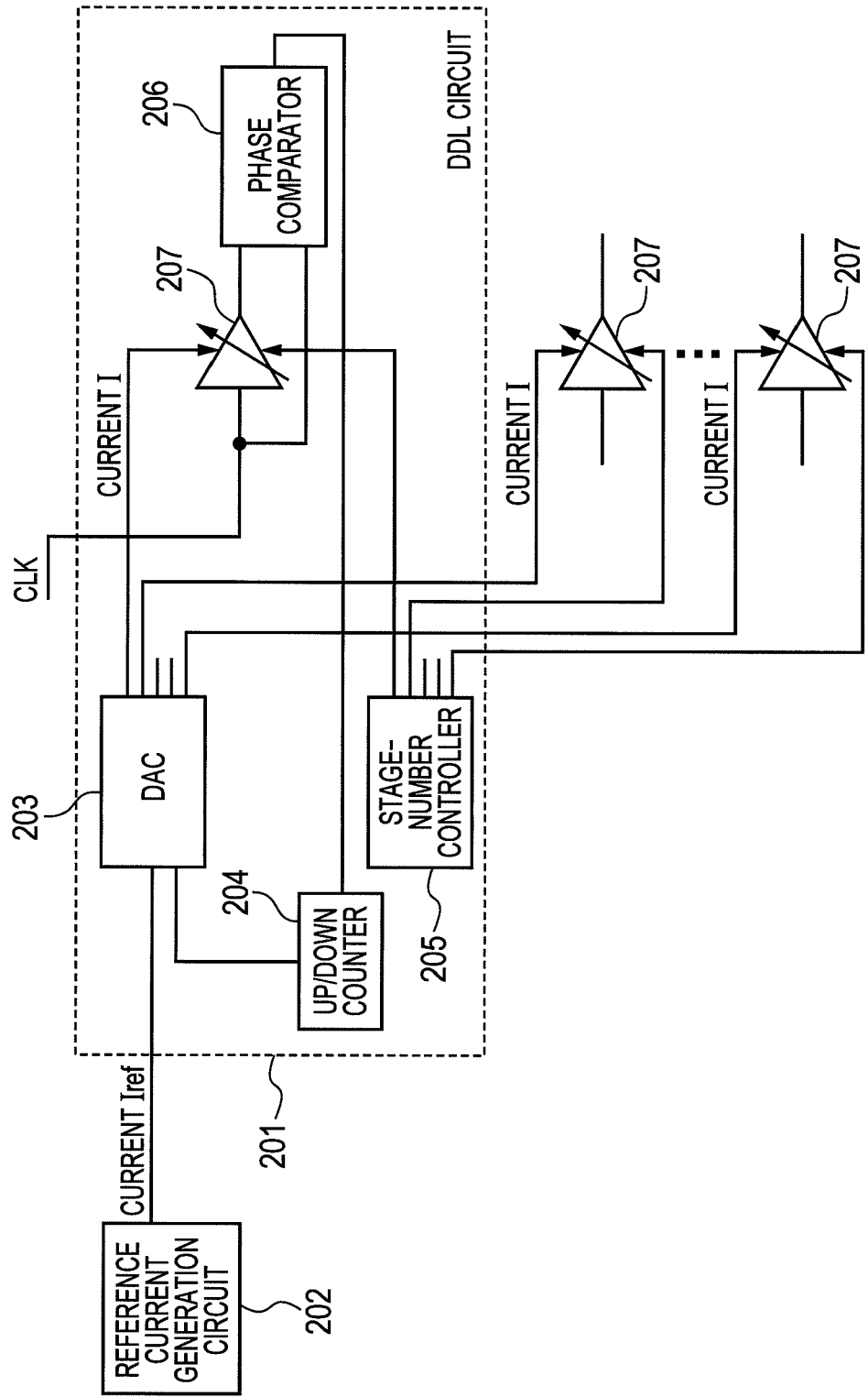
FIG. 2 is a view showing an embodiment of a DLL circuit according to the invention.

In FIG. 2, there is shown a DLL circuit 201 for use in clock adjustment to read data from a data signal at the IF 104. The DLL circuit 201 is connected to a reference current generation circuit 202. The DLL circuit 201 is provided with a digital/analog conversion circuit (DAC) 203, an up/down counter 204, a stage-number controller 205, a phase controller 206, and a delay circuit 207. A control value, such as a current value I or a counter value, set by the DLL circuit 201, is utilized at respective delay circuits 207, 207, including those outside the DLL circuit 201.

Figure 3:
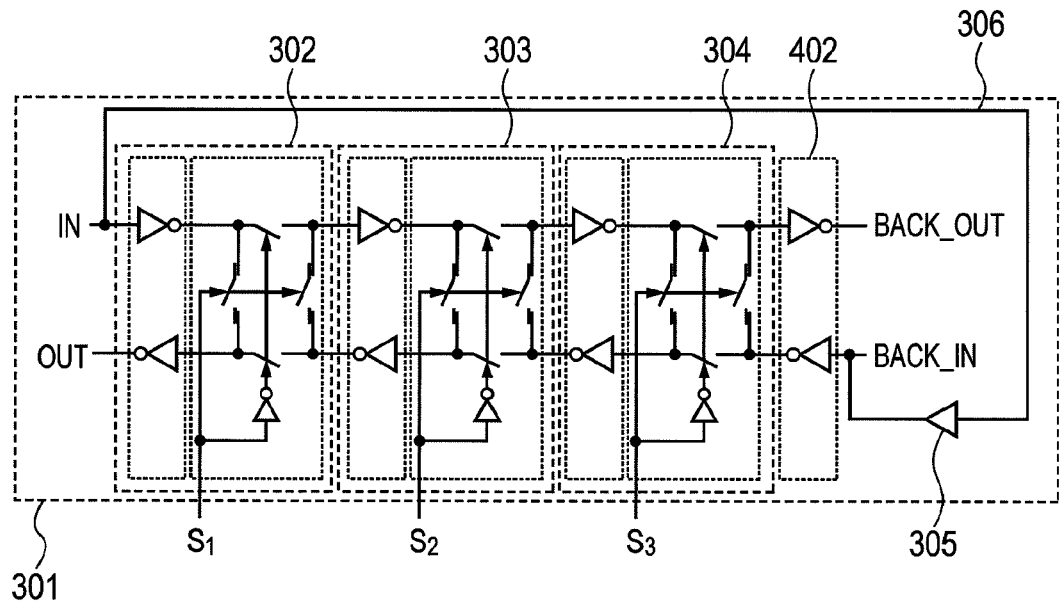
FIG. 3 is a view showing an embodiment of a delay circuit according to the invention.

In FIG. 3, there is shown a delay circuit 301 that is a multi-stage switching-type delay circuit as an embodiment of a delay circuit 207. A signal is inputted to the delay circuit 301 via an input IN, and a signal delayed by the delay circuit 301 is outputted from an output OUT. Further, BACK_OUT, and BACK_IN are provided on a side of the delay circuit 301, opposite from the input IN and the output OUT. The number of stages of the delay circuit 301 is three, and the delay circuit 301 is provided with a first stage 302, a second stage 303, and a third stage 304.

Figure 4:
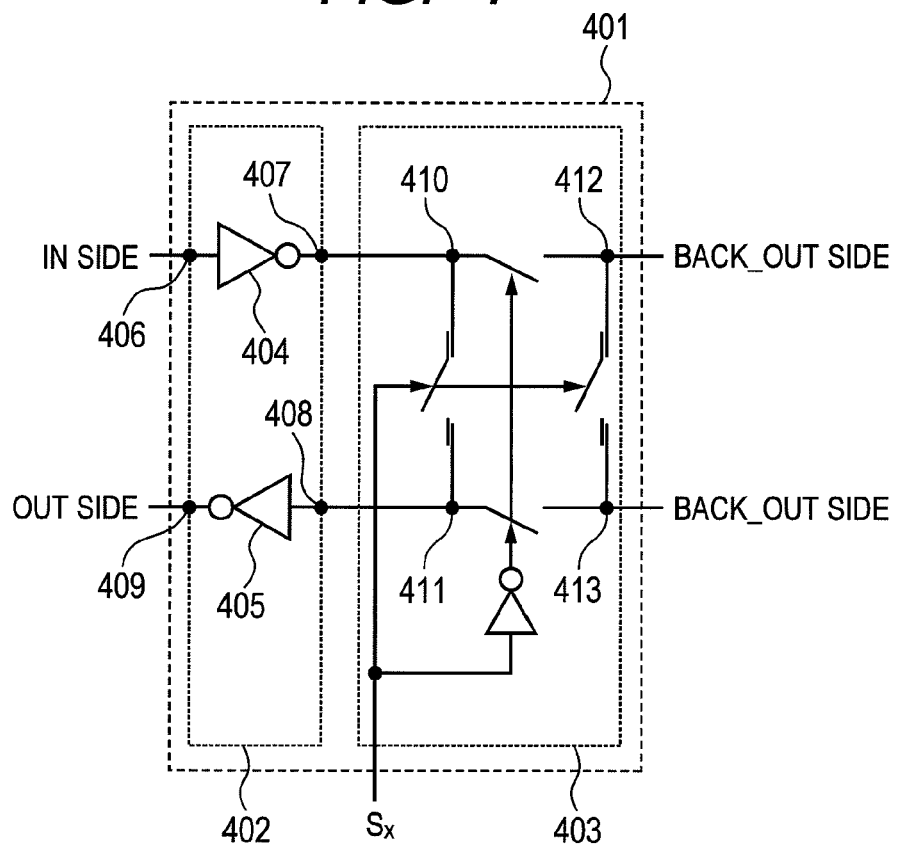
FIG. 4 shows an example of a configuration of a stage of a delay circuit according to the invention.

In FIG. 4, there is shown a stage 401 that is used in the stages 302 to 304, respectively. The stage 401 includes a delay unit 402, and a selector unit 403. Since the stages 302 to 304 are connected to each other in succession, at least one delay unit 402 is disposed in such a way as to be sandwiched between the selector units 403 of adjacent stages in the delay circuit 301.

Figure 5:
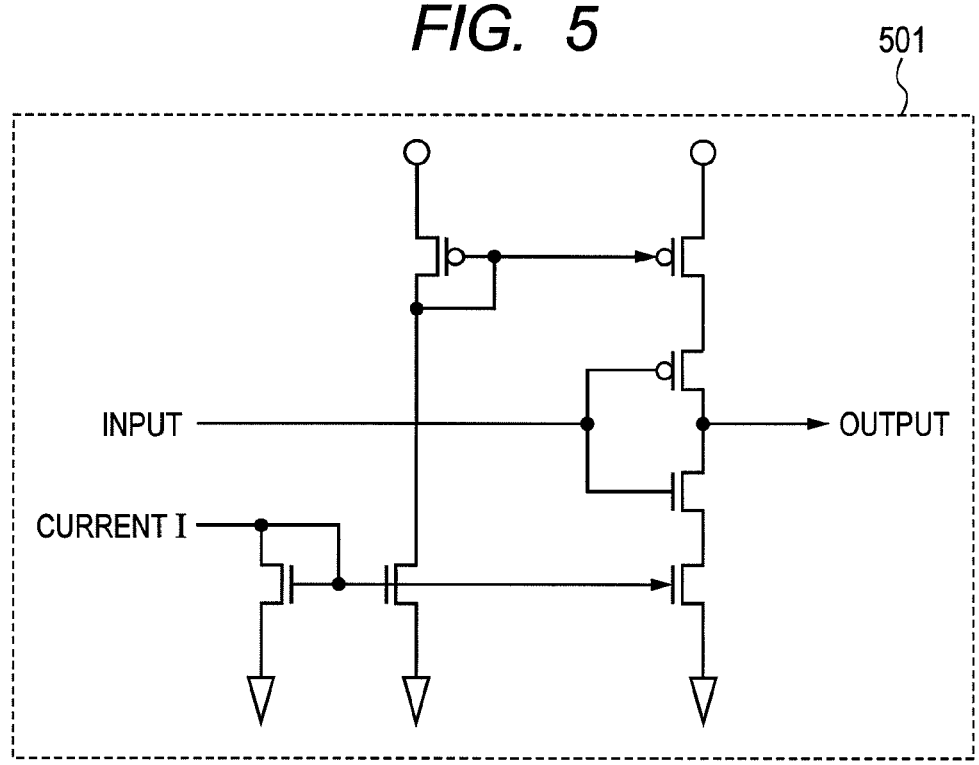
FIG. 5 is a view showing an example of an inverter used in a delay circuit according to the invention.

The delay unit 402 includes an inverter 404, and an inverter 405 as a delay element. In the delay unit 402, a signal inputted from a delay unit first input 406 is outputted from a delay unit first output 407 via the inverter 404. Further, in the delay unit 402, a signal inputted from a delay unit second input 408 is outputted from a delay unit second output 409 via the inverter 405. The inverter 404, and the inverter 405 each are realized by use of, for example, an inverter 501 in FIG. 5. The inverter 501 can be controlled by a current I as a control value set by the DLL circuit 201.

The delay unit first output 407 is connected to a selector unit first input 410 of the selector unit 403. The delay unit second input 408 is connected to a selector unit second output 411 of the selector unit 403. Further, the selector unit 403 comprises selectors for switching back and forth connection between the selector unit first input 410 and the selector unit second output 411, connection between a selector unit second input 413 and a selector unit first output 412, connection between the selector unit first input 410 and the selector unit first output 412, and connection between the selector unit second input 413 and the selector unit second output 411, respectively. The respective selectors of the selector unit 403 are realized by switches controlled in association with a select signal $S_x$ described later, the switches being provided for the connection between the selector unit first input 410 and the selector unit second output 411, the connection between the selector unit second input 413 and the selector unit first output 412, the connection between the selector unit first input 410 and the selector unit first output 412, and the connection between the selector unit second input 413 and the selector unit second output 411, respectively.

If the connection between the selector unit first input 410 and the selector unit first output 412, and the connection between the selector unit second input 413 and the selector unit second output 411 are selected, a signal is sent to a next stage. If the connection between the selector unit first input 410 and the selector unit second output 411, and the connection between the selector unit second input 413 and the selector unit first output 412 are selected, a signal is turned back. A select signal $S_x$ for controlling the number of turn-back stages is inputted to the selector unit 403. With the present embodiment, since the number of the turn-back stages is three, x=1, 2, 3. If $S_x$ is "Low" indicating a low potential state, the signal is sent to the next stage. If $S_x$ is "High" indicating a high potential state, the signal is turned back.

The delay circuit 301 further comprises a delay unit 402 after a final stage 304 thereof. Further, the delay circuit 301 comprises a connection 306 disposed between the input IN and an input unit BACK_IN via a buffer 305.

Figure 6:
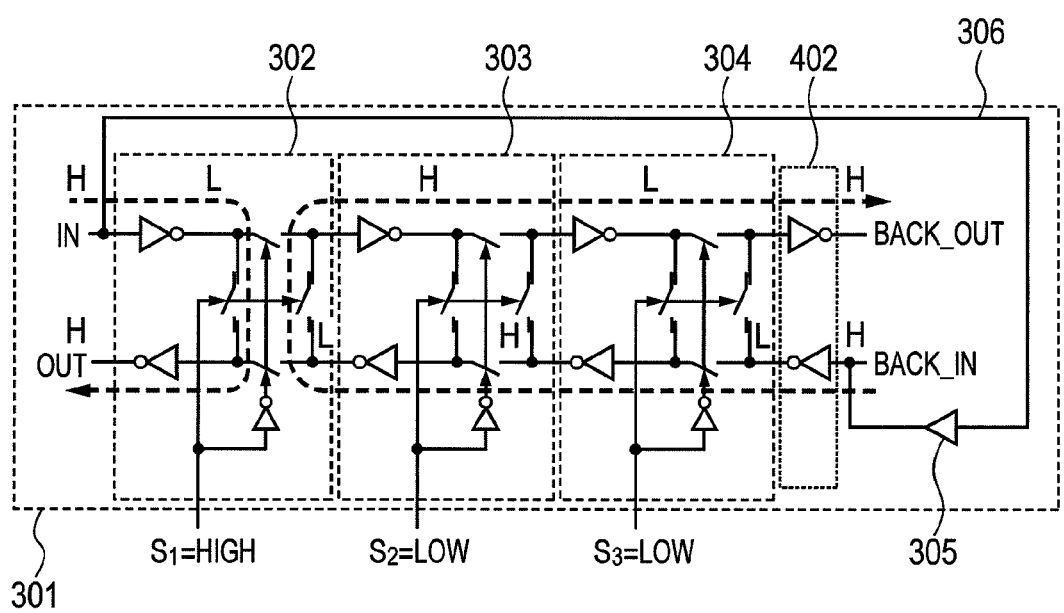
FIG. 6 is a view showing a state of an embodiment of a delay circuit according to the invention, before switching of the number of stages.

An operation of the delay circuit 301 is described with reference to FIGS. 6, and 7. FIG. 6 is a view showing an operation state of the delay circuit 301 when $S_1$ is "High", and S2 and S3 each are "Low." When the input IN is in a "High" state at a high potential, the signal in the "High" state is inputted from the input unit BACK_IN side as well. Accordingly, the switching between the "High" state at the high potential and a "Low" state at a low potential occurs across the inverter, whereupon a potential state shown in FIG. 6, that is, a logic state results. Herein, a potential of the selector unit of the stage where "High" is inputted to $S_1$ is the low potential "Low". More specifically, in the stage 302, the selector unit first input 410, the selector unit first output 412, the selector unit second input 413, and the selector unit second output 411 are identical in potential to each other, that is, at the low potential "Low", representing the same logic state.

Figure 7:
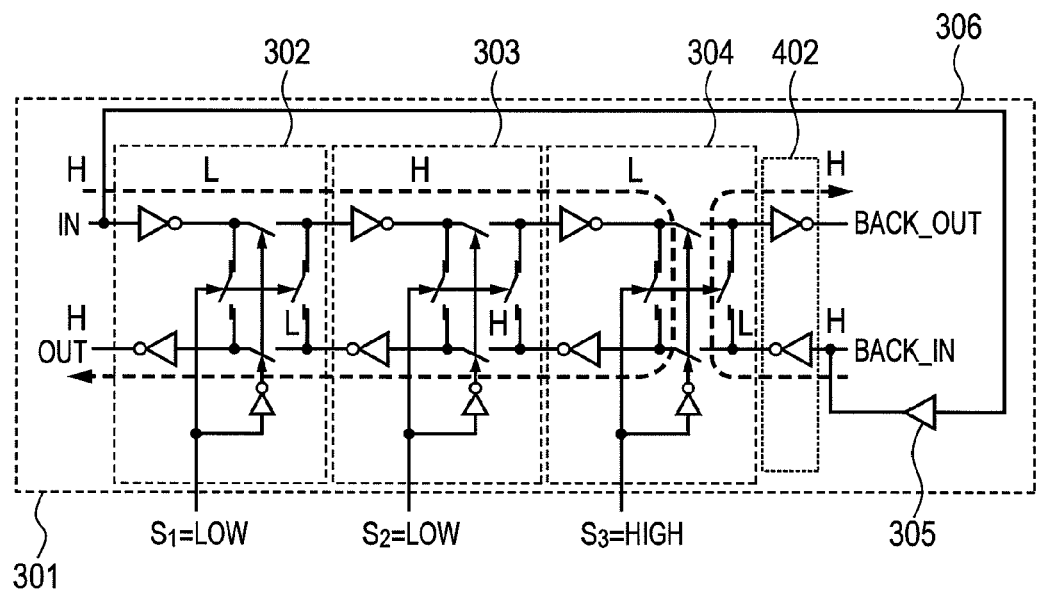
FIG. 7 is a view showing a state of the embodiment of the delay circuit of FIG. 6 according to the invention, after switching of the number of stages.

FIG. 7 shows an operation state of the delay circuit 301 when $S_1$, $S_2$ each are "Low", and $S_3$ is turned "High", as shifted from the state of the operation depicted in FIG. 6. More specifically, FIG. 7 shows the operation state where a turn-back position is shifted from the stage 302 to the stage 304.

In this case, there is no change in pattern of "High" in the high potential state as well as "Low" in the low potential state between before shifting (FIG. 6) and after shifting (FIG. 7). Accordingly, in the delay circuit 301, shifting from the high potential "High" to the low potential "Low", and vice versa does not occur between before and after the shifting. More specifically, no change occurs to the logic state of each of internal nodes of the delay circuit 301, so that no hazard occurs. The reason why occurrence of a hazard is inhibited is because the delay circuit 301 has the connection 306 disposed between the input IN and the input unit BACK_IN via the buffer 305, so that the selector unit first input 410, the selector unit first output 412, the selector unit second input 413, and the selector unit second output 411 are identical in potential to each other are in states identical in potential to each other, that is, in the same logic state, in the turn-back stage before switching of the number of stages, and a change accompanying the switching of the number of stages does not occur to the logic state of each of the internal nodes of the delay circuit 301.

Thus, the delay circuit 301 is a stage-numbers switching type delay circuit, and the input IN of the delay circuit 301 is connected to a stage that is not selected as a path for causing a delay to prevent the logic state of each of the internal nodes of the delay circuit from being changed between before and after shifting. Therefore, the hazard occurrence can be inhibited.

Figure 8:
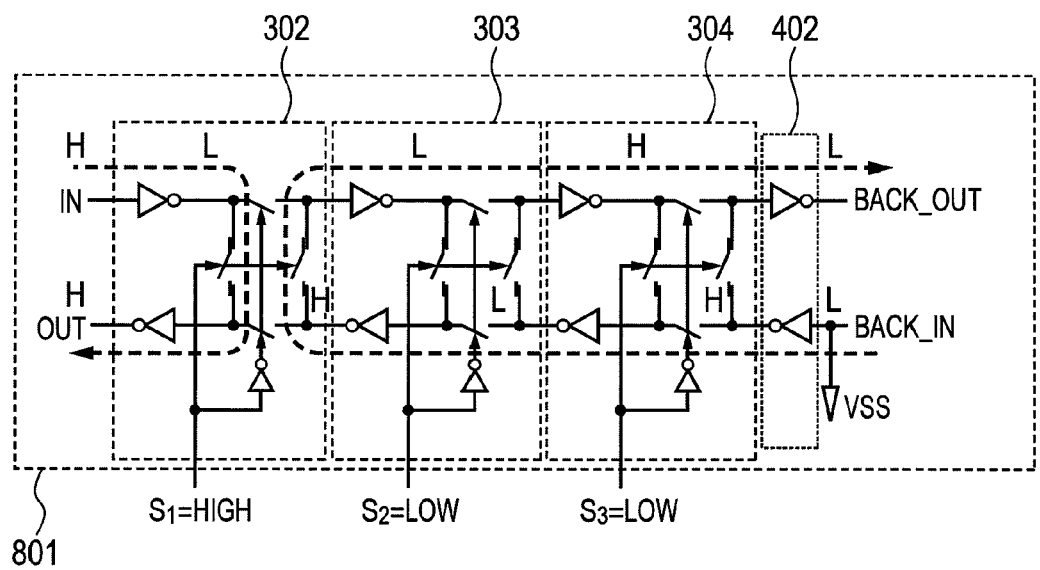
FIG. 8 is a view showing a state of a delay circuit as an object for comparison with the embodiment of the delay circuit of FIG. 6 according to the invention, before switching of the number of stages.
Figure 9:
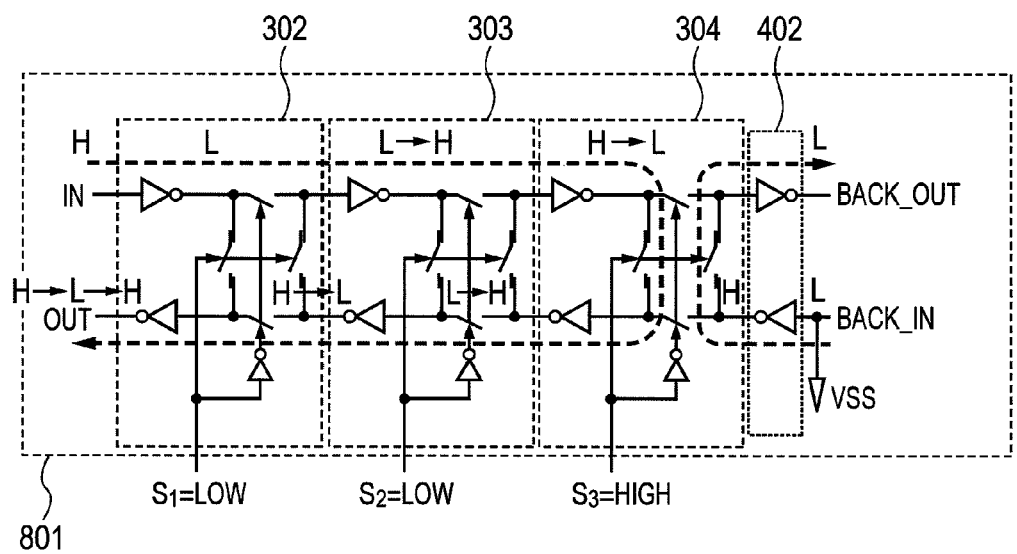
FIG. 9 is a view showing a state of a delay circuit as an object for comparison with the embodiment of the delay circuit of FIG. 7 according to the invention, after switching of the number of stages.

In FIGS. 8, and 9, there is shown a delay circuit 801 as an object for comparison with the present invention. The delay circuit 801 does not have the connection 306 disposed between the input IN and the input unit BACK_IN via the buffer 305. However, a power supply VSS, that is, the low potential "Low" is connected to the input unit BACK_IN instead. The reason why the power supply VSS is connected thereto is to prevent a circuit portion outside a path from the input of the delay circuit 801 to the output thereof from turning unpredictable. Connection of a circuit to the power supply VSS in order to prevent the circuit from turning unpredictable is a technique commonly adopted.

In FIG. 8, there is shown a state where $S_1$ is "High", and $S_2$, $S_3$ each are "Low". More specifically, a signal is turned back in a stage 302. In this case, since the power supply VSS is connected to an input unit BACK_IN side of the delay circuit 801, the selector unit first output 412, and the selector unit second input 413 are each fixed at the high potential "High" in the stage 302. Accordingly, in the case where the selector unit first input 410, and the selector unit second output 411 are at the low potential "Low" at timing for the switching of the number of stages, as shown in FIG. 8, if the switching of the number of stages is executed, as shown in FIG. 9, this will cause the logic state of the internal node to undergo a change, and the logic state prior to the switching of the number of stages is reflected in an output before the change settles into its normal state, so that hazards occur corresponding to two delay elements. In this case, the hazards occur as the output shifts from the high potential "High" to the low potential "Low", and turns back to the high potential "High", as shown in FIG. 9.

As described above, in the case where the connection between the selector unit first input 410 and the selector unit second output 411, and the connection between the selector unit second input 413 and the selector unit first output 412 are selected in the selector of one stage of the delay circuit 301, the selector unit second input 413 of the final stage 304 is connected to the input IN of the delay circuit 301 via the buffer 305, and the inverter 405 such that the selector unit first input 410, the selector unit first output 412, the selector unit second input 413, and the selector unit second output 411, in a selected stage, are aligned in potential state with each other, so that the delay circuit 301 can inhibit the occurrence of a hazard. As a result, it will be no longer required that the DLL circuit 201, and the semiconductor device 101, having the delay circuit 301, be provided with a circuit for removal of a hazard, so that it is possible to reduce circuit scale, achieve low power consumption, and eliminate the need for time waiting for hazard removal, thereby enabling processing speed of the semiconductor device 101 to be increased.

Second Embodiment

Figure 10:
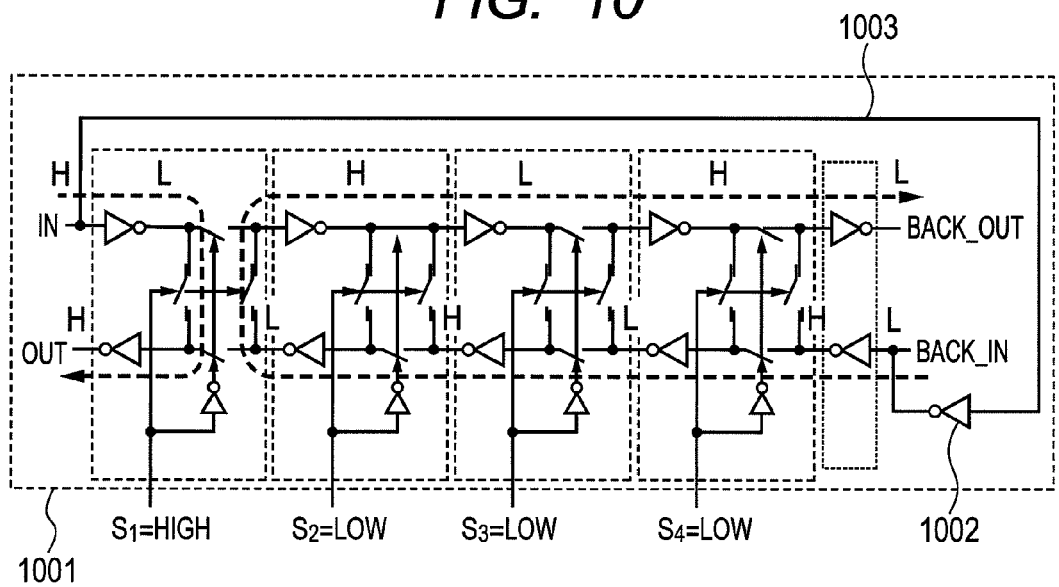
FIG. 10 is a view showing a delay circuit according to another embodiment of the invention.

While with the first embodiment of the invention, there is shown an embodiment in the case of odd number stages, with the case of a second embodiment of the invention, there is shown an embodiment in the case of even number stages. FIG. 10 shows a multi-stage switching-type delay circuit 1001 comprised of an even number of stages, according to a second embodiment of the invention. The delay circuit 1001 differs from the delay circuit 301 in that the number of the stages is changed from three to four, and there is provided connection 1003 between the input IN and the input unit BACK_IN via an inverter 1002 instead of the connection 306 between the input IN and the input unit BACK_IN via the buffer 305.

For example, in the case where $S_1$ is turned "High" while $S_2$, $S_3$ and $S_4$ are each turned "Low", that is, in the case where a signal is turned back in the first stage, the selector unit first input 410, the selector unit first output 412, the selector unit second input 413, and the selector unit second output 411 are turned identical in potential state to each other, that is, will be at the low potential "Low", as shown in FIG. 4.

Thus, if the inverter 1002 is provided instead of the buffer 305, the selector unit first input 410, the selector unit first output 412, the selector unit second input 413, and the selector unit second output 411, in the turn-back stage, are turned identical in potential state to each other, that is, in a same logic state. Accordingly, as is the case with the first embodiment, the delay circuit 1001 can inhibit the occurrence of a hazard. As a result, since it is no longer required that the DLL circuit 201, and the semiconductor device 101, having the delay circuit 1001, be provided with a circuit for removal of a hazard, it is possible to reduce circuit scale, achieve low power consumption, and eliminate the need for time waiting for hazard removal, thereby enabling processing speed of the semiconductor device to be increased.

Third Embodiment

Figure 11:
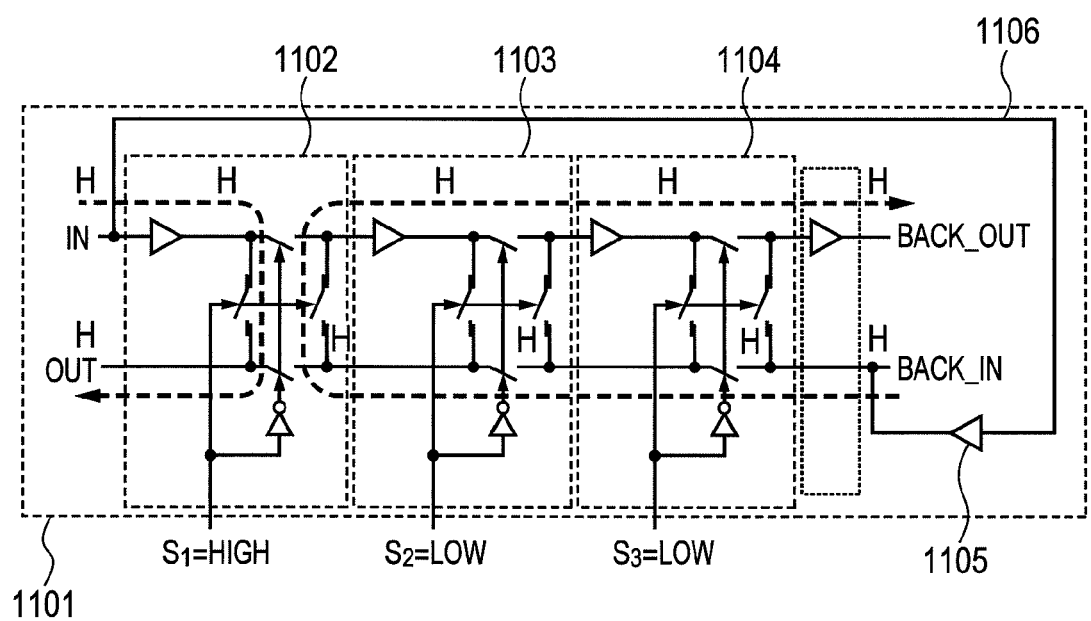
FIG. 11 is a view showing a delay circuit according to still another embodiment of the invention.

While with the first embodiment, and the second embodiment, respectively, there is adopted the delay circuit using the inverter serving as the delay element, with a third embodiment of the invention, there is shown an example in which a buffer is used as a delay element. FIG. 11 shows a delay circuit 1101 using a buffer (1102, 1103, 1104) instead of the inverter, according to a third embodiment of the invention.

The delay circuit 1101 differs from the delay circuit 301 in that the two inverters in the delay unit 402 are replaced with one buffer. By so doing, a potential state, that is, a logic state becomes uniform throughout the delay circuit 1101, so that a hazard occurrence can be inhibited. As a result, it will be no longer required that the DLL circuit, and the semiconductor device, having the delay circuit 1101, be provided with a circuit for removal of a hazard, so that it is possible to reduce a circuit scale, achieve low power consumption, and eliminate the need for time waiting for hazard removal, thereby enabling a processing speed of the semiconductor device to be increased. Incidentally, in FIG. 11, 1105 designates a buffer and 1106 designates a connection.

Fourth Embodiment

Figure 12:
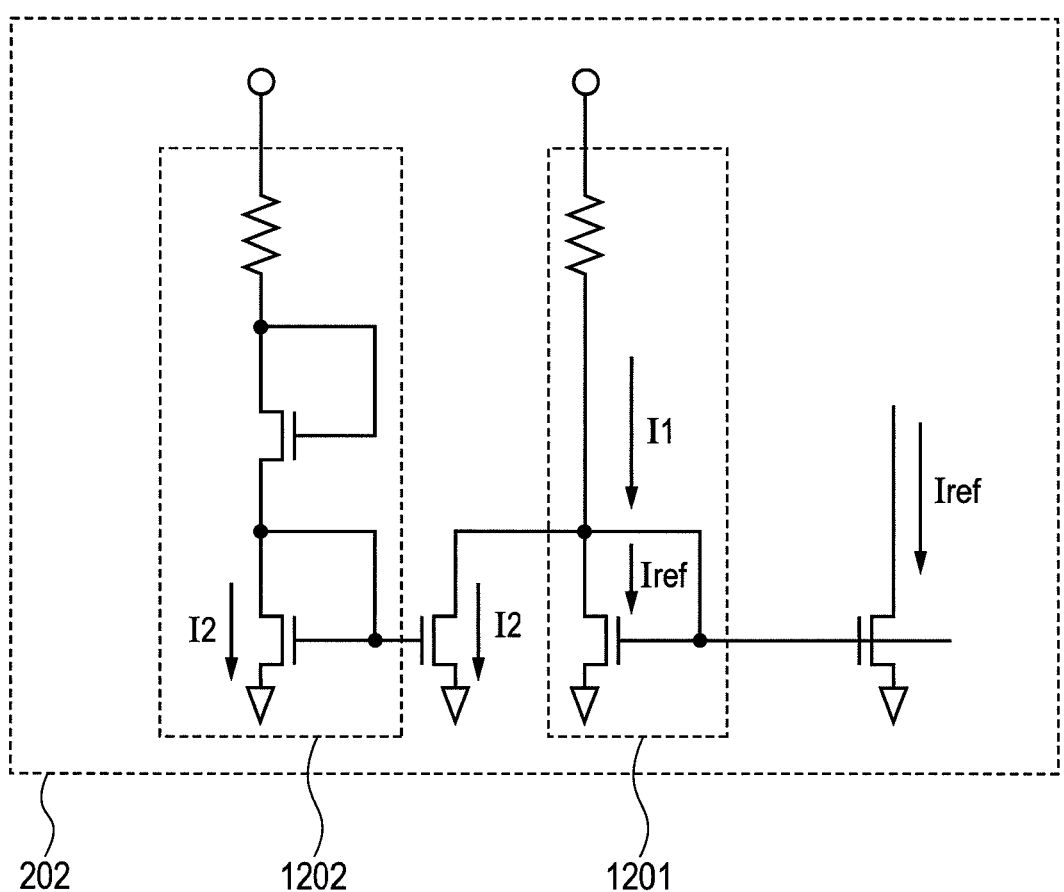
FIG. 12 is a view showing an example of an embodiment of a reference current generation circuit according to the invention.

FIG. 12 shows an example of an embodiment of the reference current generation circuit 202 according to the invention. A reference current Iref is outputted by pulling out a reference current I2 generated from a secondary current source MOS 1202 from a reference current I1 generated from a first current source MOS 1201, whereupon $$Iref = I1 - I2$$

While I1 has primary dependency on variation in voltage/current, I2 has secondary dependency, so that if the current I2 high in dependency is pulled out, this will enable the reference current Iref to have reverse characteristics against the variation in voltage/current. Variation in the reference current Iref against the variation in voltage/current can be inhibited by making use of the reverse characteristics.

Fifth Embodiment

Figure 13:
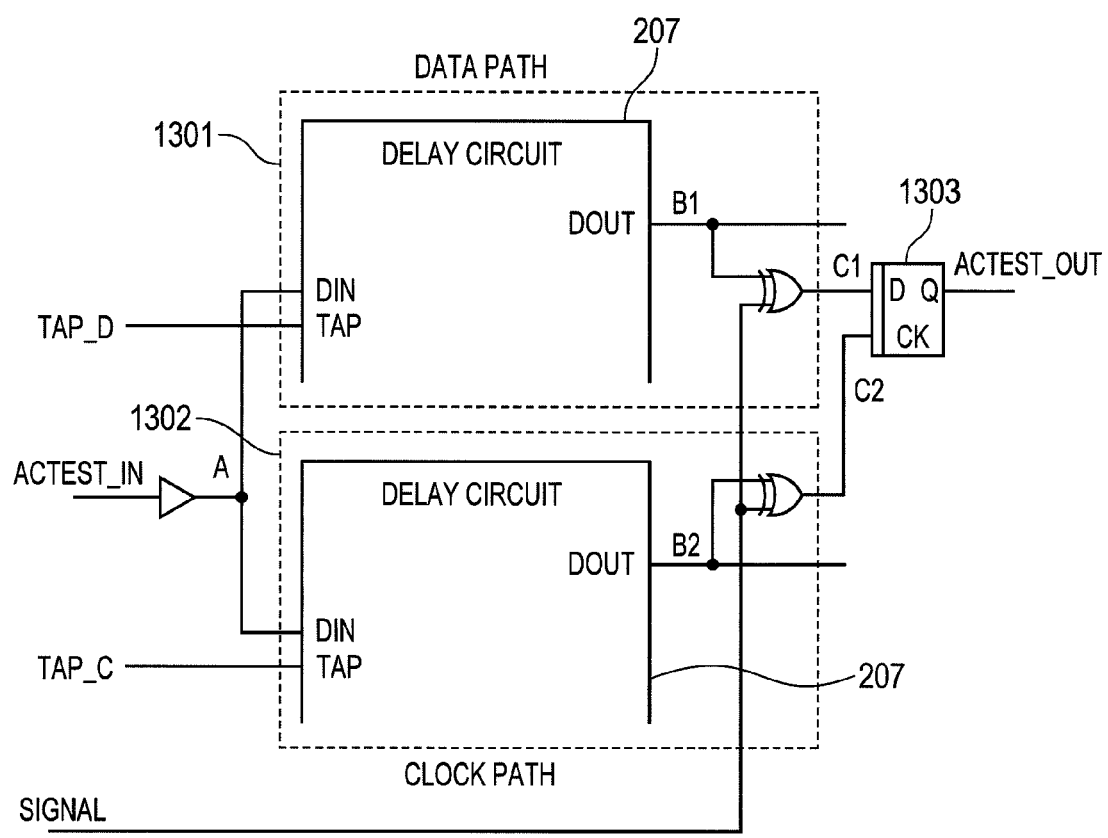
FIG. 13 is a view showing an example of an embodiment of a simplified delay test circuit according to the invention.

FIG. 13 shows an example of an embodiment of a simplified delay test circuit according to the invention. Provided are a data path 1301 and a clock path 1302, each thereof using a delay circuit having a same characteristic, together with a phase comparator 1303 for comparing those paths with each other. With the test circuit, setting of the number of stages is differentiated between the delay circuit of the data path 1301 and the delay circuit of the clock path 1302 before an actuation signal ACTEST_IN is inputted. Because data fetched by the phase comparator 1303 is decided upon according to the number of stages in the respective delay circuits, delay abnormality in the delay circuit can be determined depending on whether or not the data fetched matches an expected value (refer to FIG. 14). Furthermore, abnormality in not only the delay element of the delay circuit but also a decoder for setting the number of the stages can be detected. Test accuracy depends on the characteristics of the phase comparator, and symmetry of paths from a branching point (A) to the respective phase comparators (C1, C2).

What is claimed is:

1. A delay circuit as a multi-stage switching-type delay circuit, comprising multiple stages, each of the stages including:
- a delay unit; and
- a selector unit,
- the delay unit having:
  - a delay unit first input;
  - a delay unit first output connected to the delay unit first input;
  - a delay unit second input;
  - a delay unit second output connected to the delay unit second input; and
  - at least one delay element, each provided between the delay unit first input and the delay unit first output, or between the delay unit second input and the delay unit second output, the selector unit having:
  - a selector unit first input connected to the delay unit first output;
  - a selector unit first output;
  - a selector unit second input;
  - a selector unit second output connected to the delay unit second input; and
  - selectors to switch connections between the selector unit first input and the selector unit second output, between the selector unit second input and the selector unit first output, between the selector unit first input and the selector unit first output, and between the selector unit second input and the selector unit second output, respectively,
- wherein an input of the delay circuit corresponds to the delay unit first input of a first stage of the multiple stages,
- wherein an output of the delay circuit corresponds to the delay unit second output of the first stage,
- wherein the selector unit first output of each stage is connected to the delay unit first input of a next stage of the multiple stages,
- wherein the selector unit second input of each stage is connected to the delay unit second output of the next stage, and
- wherein, if the selector unit in one stage of the multiple stages of the delay circuit selects the connection between the selector unit first input and the selector unit second output, and the connection between the selector unit second input and the selector unit first output, the selector unit second input is connected to the input of the delay circuit such that the selector unit first input, the selector unit first output, the selector unit second input, and the selector unit second output are identical in logic state to each other in the one stage.

2. The delay circuit according to claim 1, wherein a first inverter as one said delay element is provided between the delay unit first input and the delay unit first output, and a second inverter as another said delay element is provided between the delay unit second input and the delay unit second output.

3. The delay circuit according to claim 2,
- wherein the number of stages of the delay circuit is an odd number, and
- wherein a selector unit second input of a final stage is connected to the input of the delay circuit via a third inverter.

4. The delay circuit according to claim 2,
- wherein the number of stages of the delay circuit is an even number, and
- wherein the selector unit second input of a final stage is connected to the input of the delay circuit via a third inverter and a fourth inverter.

5. The delay circuit according to claim 1, wherein the at least one delay element is a buffer.

6. A DLL circuit comprising the delay circuit according to claim 1.

7. A semiconductor device comprising the DLL circuit according to claim 6.

8. A delay circuit as a multi-stage switching-type delay circuit, comprising multiple stages, each of the stages including:
- selectors to switch connections between a first input and a second output, between a second input and a first output, between the first input and the first output, and between the second input and the second output, respectively,
- wherein an input of the delay circuit is connected to the first input of a first stage of the multiple stages,
- wherein an output of the delay circuit is connected to the second input of the first stage,
- wherein the first output of each stage is connected to the first input of a next stage of the multiple stages,
- wherein the second input of each stage is connected to the second output of the next stage,
- wherein at least one of a connection between the first output of each stage and the first input of the next stage, and a connection between the second input of each stage and the second output of the next stage, is made via a delay element, and
- wherein, if the selector unit in one stage of the multiple stages of the delay circuit selects the connection between the first input and the second output and the connection between the second input and the first output, the second input of the final stage is connected to the input of the delay unit such that the first input, the first output, the second input, and the second output are identical in logic state to each other in the one stage.

9. A DLL circuit comprising the delay circuit according to claim 8.

10. A semiconductor device comprising the DLL circuit according to claim 9.

* * * * *